United States Patent [19]

Woolston

[11] 4,015,493
[45] Apr. 5, 1977

[54] DYNAMIC PRODUCTION COUNTER FOR A CORRUGATOR

[75] Inventor: Allan Brent Woolston, Wynnewood, Pa.

[73] Assignee: Molins Machine Company, Inc., Camden, N.J.

[22] Filed: Mar. 15, 1976

[21] Appl. No.: 666,847

[52] U.S. Cl. .................................... 83/13; 83/69; 83/522

[51] Int. Cl.² ........................................ B26D 7/28

[58] Field of Search ............ 83/13, 37, 69, 76, 522; 235/103.5 R, 151.1, 151.11

[56] References Cited

UNITED STATES PATENTS

| | | | |
|---|---|---|---|
| 3,411,388 | 11/1968 | Rappaport | 83/522 X |
| 3,604,300 | 9/1971 | Allison et al. | 83/76 |
| 3,760,669 | 9/1973 | Rosenthal et al. | 83/522 X |

Primary Examiner—Frank T. Yost
Attorney, Agent, or Firm—Seidel, Gonda & Goldhammer

[57] ABSTRACT

An improved production counter for a corrugator including a knife for cutting web material into sheets. First and second digital signals are generated. The first digital signal indicates a predetermined number of sheets of web material to be cut by the knife. The second digital signal indicates the instantaneous number of sheets of web material cut by the knife. The second digital signal is cyclically incremented and decremented by predetermined counts. Coincidence of the cyclically varied second digital signal to the first digital signal is detected. A warning signal indicative of a preselected number of sheets of web material remaining to be cut is generated when the cyclically varied second digital signal and the first digital signal coincide.

13 Claims, 8 Drawing Figures

COUNT PRODUCTION CONTROL

COUNT SCRAP CONTROL

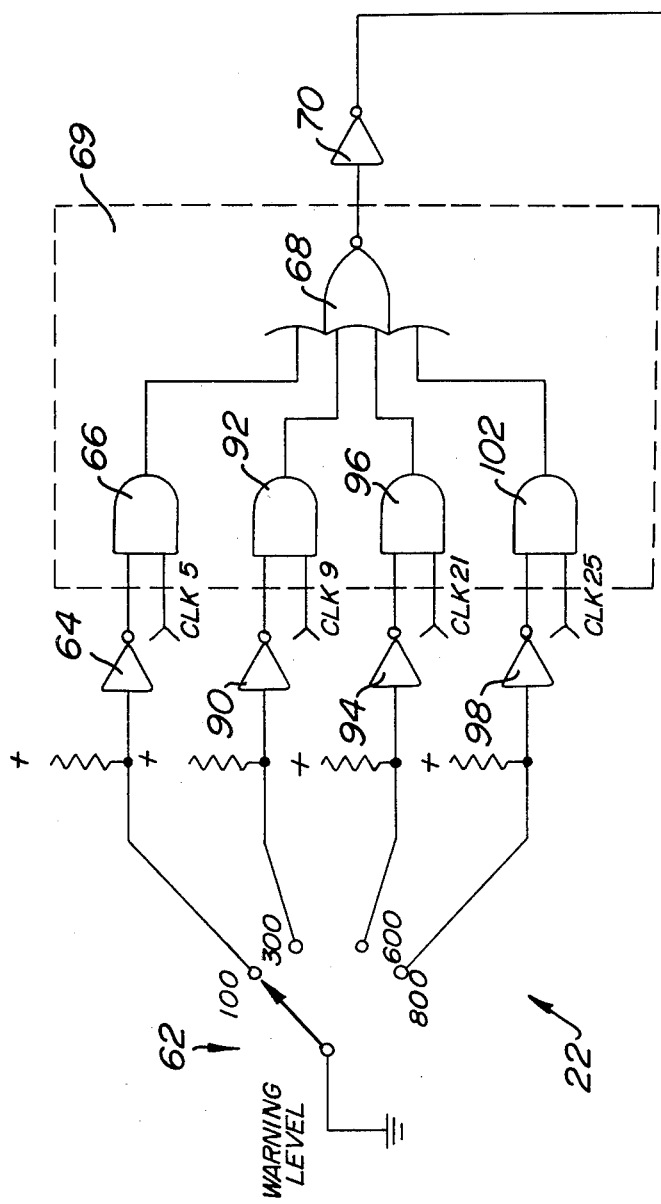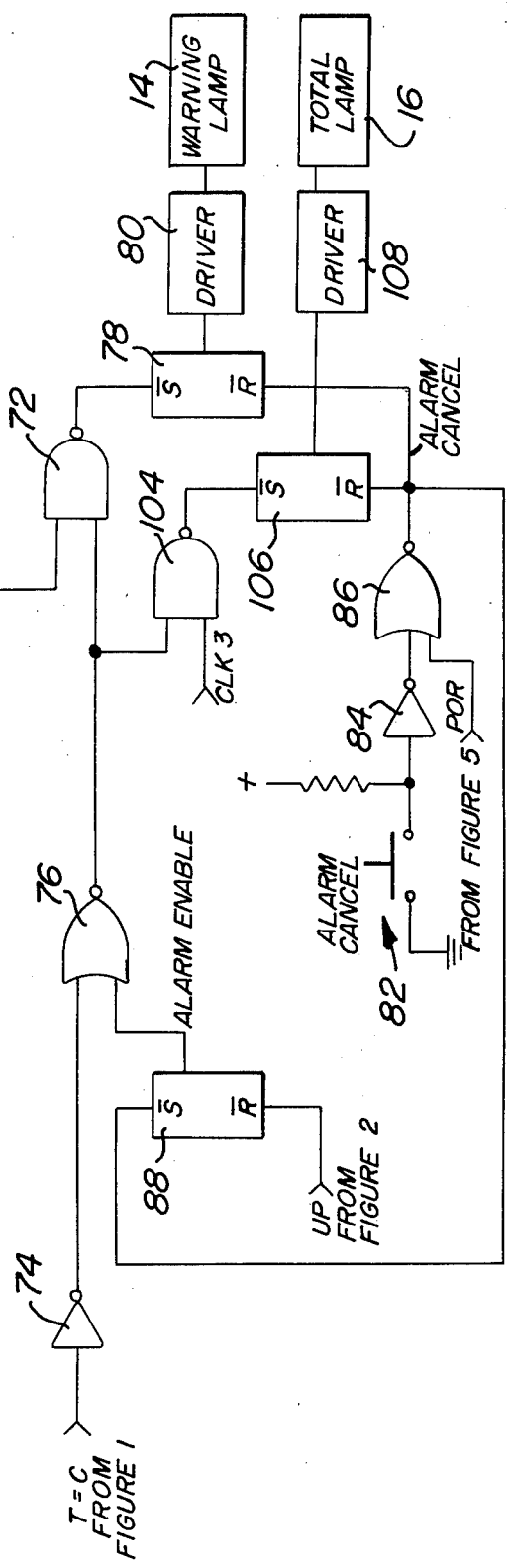
FIG. 4 WARNING SELECT & ALARMS

CLEAR

DYNAMIC CONTROL INPUT WAVEFORMS

DYNAMIC CONTROL

STROBE & DISPLAY

DYNAMIC PRODUCTION COUNTER FOR A CORRUGATOR

BACKGROUND OF THE INVENTION

The present invention relates to a production counter for indicating the number of sheets of material automatically cut by a knife. In particular, the invention relates to a dynamic production counter for indicating the number of sheets of material actually cut by the knife of a corrugator as well as the number of sheets remaining to be cut before a production order is finished.

In a corrugator for producing paperboard, liner is fed to a single facer machine. A corrugating machine is also fed to the single facer machine. In the single facer machine, the corrugating medium is adhesively bonded to the liner to form a single faced web.

The single faced web is fed by a conveyor to the upper level of a bridge. Another single facer machine may be provided to produce a second single faced web which is transported by a second conveyor to the lower level of the bridge.

The singled faced web leaves the bridge along a bridge guide. The bridge guide feeds the single faced web through a preheater and glue machine to a double facer machine. The glue machine applies an adhesive bonding agent to the exposed crests of the flutes on the single faced web. The web is bonded to a liner fed to the double facer machine. The double facer machine maintains the single face web in contact with the liner while subjecting these components to controlled heat to gelatinize a starch solution used as an adhesive bonding agent.

The double faced web is fed to the slitter and scorer which determines the ultimate width of the paperboard to be produced as well as the lines along which it may be folded. The web is then fed to rotary cutting knives for severence into sheets of predetermined lengths.

The lay-out of a corrugator combining the above components is described in detail in application Ser. No. 369,632 entitled "Corrugator" filed June 13, 1973 incorporated herein by reference.

A measuring wheel senses the speed of travel of the double faced web and generates a stream of pulses in response thereto. In addition, the measuring wheel is used to generate a stable singal to indicate that double faced web is present at the double facer machine output. The rotation of the cutting knives is sensed by a magnetic pick-up or the like which generates a stream of knife pulses indicative of the sheets cut by the knives. Each knife pulse represents one sheet of web material. The measuring wheel and knife pick-up are substantially as described in U.S. Pat. No. 3,411,388; and entitled "Integrated Sheet Production Control System" issued to Rappaport on Nov. 19, 1968.

Heretofore, to provide a count of the number of sheets of web material cut by the knives in a corrugator, it was necessary to use two or more sets of counters or two or more sets of comparators. A system using two or more sets of counters is described in U.S. Pat. No. 3,411,388. A production counter is preset to the production order, that is, the predetermined number of sheets of web material to be cut by the knives. The knife pulses are used to count down the production counter. The production count, that is, the number of sheets actually cut by the knives, is not tracked directly by the counter. Instead, the contents of the counter indicate the number of sheets of material remaining to be cut to complete the production order. The stages of the counter are hardwired to a detection circuit to provide an indication of a limited number of warning levels. Each warning level represents a predetermined number of sheets to be cut to fill the production order. If a five stage counter is used, the warning levels indicate one, ten, one hundred, one thousand or ten thousand sheets remaining to be cut. The warning levels are fixed by the system wiring.

The correction of the production count for scrap sheets takes place at the pulse repetition frequency of the knife pulses. As a result, if the number of scrap sheets is incorrectly estimated, the scrap count cannot be revised instantaneously.

The number of scrap sheets cut by the knives are observed by the operator. The operator estimates the number of scrap sheets and presets a scrap counter to that number. To correct for the scrap sheets, the production count is halted by temporarily disconnecting the production counter from the knife pulse line. The knife pulses are transferred to the scrap counter which counts down from the preset count to zero. When the scrap counter reaches zero, the production count is resumed by transferring the knife pulses back to the production counter. The scrap counter is disconnected from the knife pulse line. Thus, the scrap counter must first be counted down at the knife pulse rate to zero before an incorrect scrap estimate can be corrected by the operator.

It is also known in the art to use a single production counter for providing an indication of the number of sheets of web material remaining to be cut. The counter is operated by the knife pulses as previously described. The output of the counter, however, is fed to two comparators. The use of two comparators significantly increases the equipments costs.

Each comparator is associated with a separate set of thumb wheel switches. One set of thumb wheel switches is preset to the production order. The other set of thumb wheel switches indicates the complement of a preselected warning level rather than the warning level itself. Thus, the switches are set to the actual number of sheets cut, rather than the number of sheets remaining to be cut, at the time the warning is to be provided to the operator. When the output of the production counter coincides with one of the thumb wheel settings, the associated comparator provides an output signal. If the thumb wheel setting for the production order is changed, the thumb wheel setting for the complement of the preselected warning level must also be changed. Thus, the warning level setting must be changed between changes in production orders.

The present invention provides a selectable warning level, virtually instanteous correction of the production count for scrap sheets, the ability to revise the estimated correction for scrap material without interrupting the production count, the elimination of multiple comparator controls, and the ability to change production orders without re-adjusting the warning level.

Applications of the invention are universal. The invention need not be limited to use in a corrugator. The invention can be used to provide a count of any type of repetitive events, including an indication of the number of such events required to occur before a predetermined count is reached.

BRIEF SUMMARY OF THE INVENTION

A production counter for a corrugator including a knife for automatically cutting web material into sheets, comprising means for generating a first digital signal indicative of a predetermined number of sheets of web material to be cut by the knife; means for providing a second digital signal indicative of the number of sheets of web material cut by the knife, means for cyclically incrementing and decrementing the second digital signal by predetermined counts to cause the signal to cyclically vary; means for detecting coincidence of the cyclically varied second digital signal to the first digital signal; and means for generating a warning signal indicative of a preselected number of sheets of web material remaining to be cut in response to the detecting means.

An advantage of the present invention is that the warning levels are selectable.

Another advantage of the invention is that the warning levels need not be re-adjusted between changes in production order.

A further advantage of the invention is that the scrap correction can be revised almost instantaneously during a production order without interrupting the production count.

A still further advantage of the invention is that it eliminates multiple comparator controls.

Other advantages will appear hereinafter.

For the purpose of illustrating the invention, there is shown in the drawings a form which is presently preferred; it being understood, however, that this invention is not limited to the precise arrangements and instrumentalities shown.

BRIEF DESCRIPTION OF THE DRAWINGS

FIG. 4 is an electrical schematic of the warning select and alarms circuit.

DETAILED DESCRIPTION OF THE INVENTION

Figure 1:
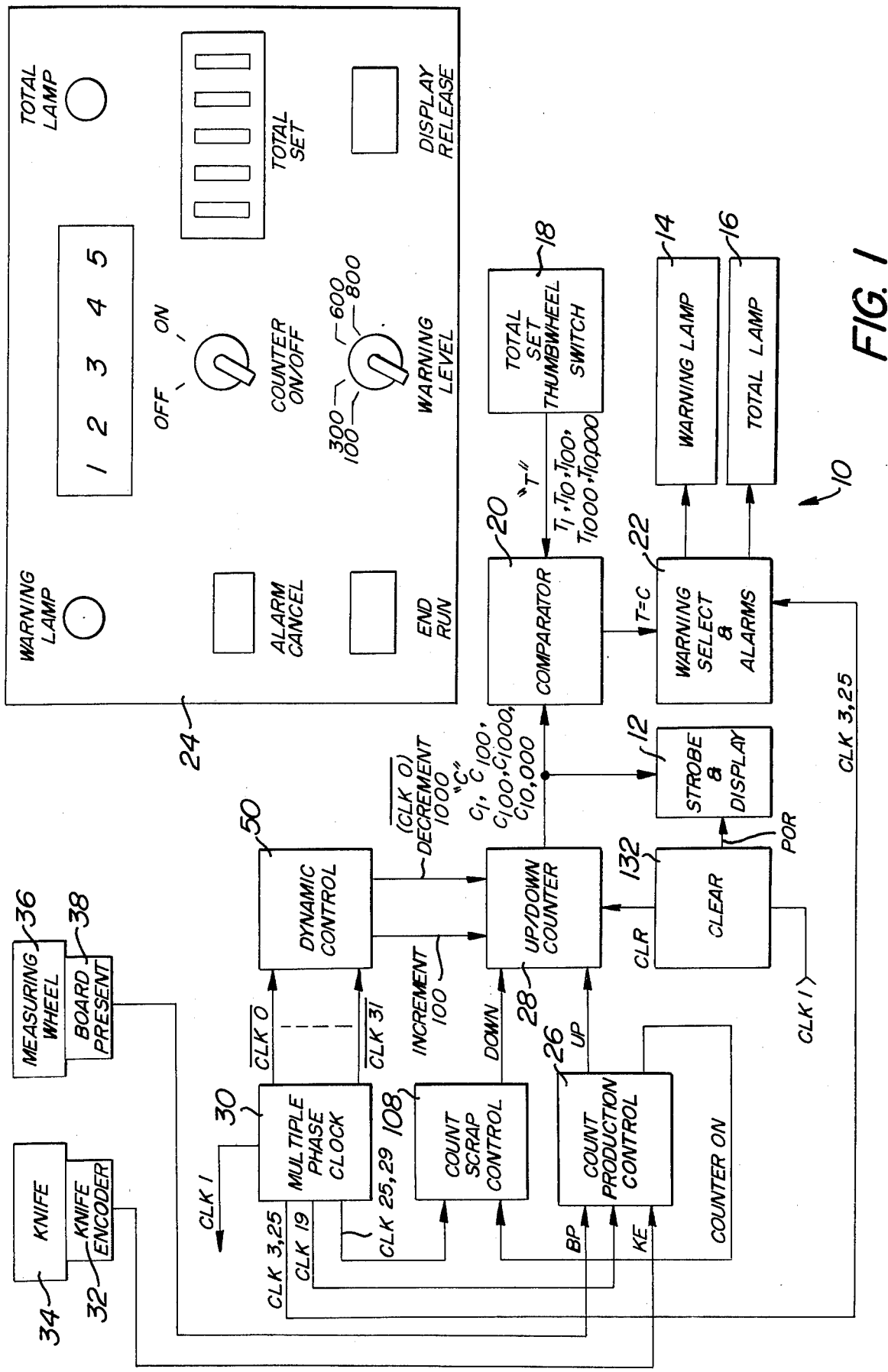
FIG. 1 is a block diagram of the present invention including a representation of a control panel.

Referring to the drawings in detail, wherein like numerals indicate like elements, there is shown in FIG. 1 a dynamic production counter for a corrugator in accordance with the present invention designated generally as 10. The dynamic production counter provides a running display of the number of sheets cut by the corrugator by means of strobe and display circuit 12. A warning lamp 14 indicates that a preselected number of sheets remains to be cut before the production order is finished. A total lamp 16 indicates that the total number of sheets in the production order has in fact been cut.

The total number of sheets to be cut in a given production order is set by the operator by manipulating total set thumb wheel switch 18. Thumb wheel switch 18 may be an Eeco 5-decade BCD switch. The BCD switch outputs are T1, T10, T100, T1000, T10000 denoted generally as "T".

Warning lamp 14 is controlled by the warning select and alarms circuit 22. The warning select and alarms circuit includes a multiple position warning level switch which is set by the operator to indicate the number of sheets remaining to be cut in a production order. Warning lamp 14 provides a visual warning signal when the warning level is reached. The warning and total lamps, total set thumb wheel switches and warning level switch, together with other control and display elements described hereinafter, may be centrally located on a panel 24.

The number of sheets cut by the corrugator is tracked by counter 28 in conjunction with count production control circuit 26. It is preferred that counter 28 be an up/down counter comprising five stages cascaded according to well known design principles. Each stage may be a TI 74192 synchronous four-bit up/down counter.

Count production control circuit 26 operates in response to knife encoder 32, board present circuit 28, and multiple phase clock circuit 30. Knife encoder 32 detects the rotation of a knife 34 and produces a KE output signal in the form of a stream of pulses. Each pulse indicates a single rotation of the knife. Each rotation corresponds to a single sheet of web material being cut. The pulse repetition frequency of the KE pulses depends on the speed of the knife. Typically, the frequency of the pulses is approximately 0.25 to 2 pulses per second.

A measuring wheel 36 detects the speed of travel of the web and triggers the board present circuit 38. The board present circuit generates a BP output signal to indicate that web material is being fed to knife 34.

Figure 6:
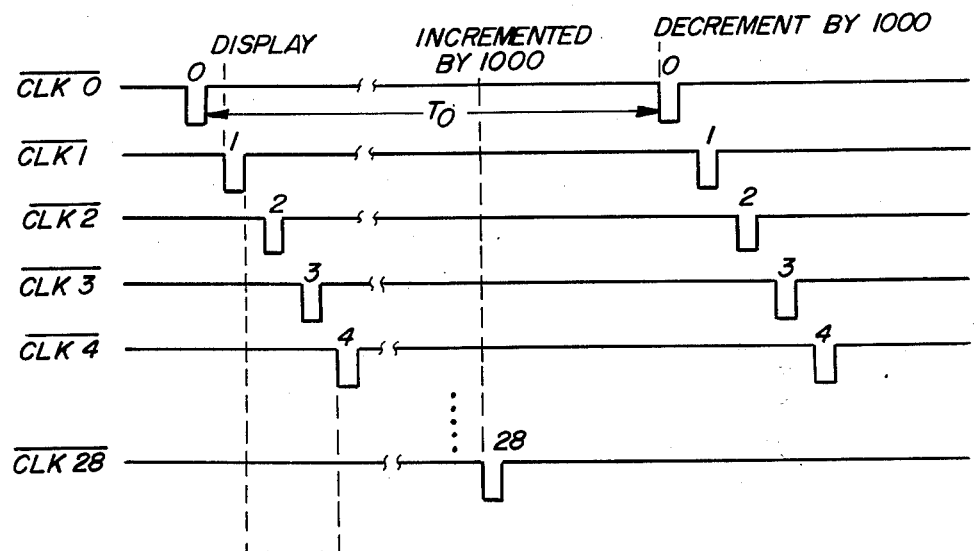
FIG. 6 is a timing diagram of the multiple phase clock pulses.

Multiple phase clock 30 synchronizes the operation of the components of the dynamic production counter. The clock generates a plurality of cyclic pulses in a predetermined phase relation. It is preferred that the clock have thirty-two parallel output lines denoted CLK 0-CLK 31, although more or less lines may be suitable as will be evident from the following description. THe clock generates a negative going pulse train on each of the $\overline{\text{CLK 0}}$-$\overline{\text{CLK 31}}$ output lines. The pulse trains have the same amplitude, duty cycle and pulse repetition frequency but are offset in phase. See FIG. 6. It is preferred that the pulse repetition frequency be approximately 62.5 Khz and the pulse duration by 250 ns. Thus, the pulse repetition frequency of each pulse train is much greater than the pulse repetition frequency of the KE pulses. That is, the pulse repetition frequency of the clock outputs is much greater than the frequency at which sheets are cut by knife 34.

The operation of each of the components of the dynamic production counter is described in detail below.

COUNT PRODUCTION CONTROL CIRCUIT

The count production control circuit 26 drives the up line input to counter 28 in synchronism with the CLK 19 pulses produced by multiple phase clock 30. The CLK 19 pulses are an inverted replica of the $\overline{\text{CLK 19}}$ pulses. The count production control circuit synchronizes the KE pulses to the CLK 19 pulses. Each KE pulse triggers pulse synchronizer 40 to invert and pass a single CLK 19 pulse to its PS output. See FIG. 2. Pulse synchronizer 40 may be a TI 74120 dual pulse synchronizer/driver.

Figure 2:
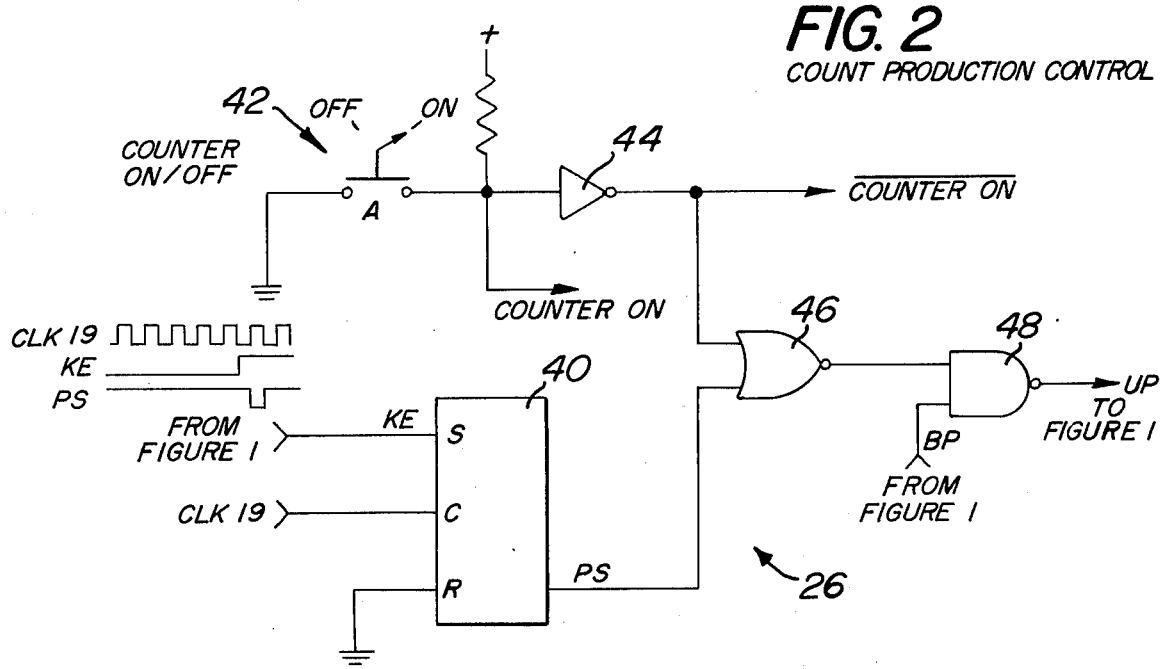
FIG. 2 is an electrical schematic of the count production control.
Figure 3:
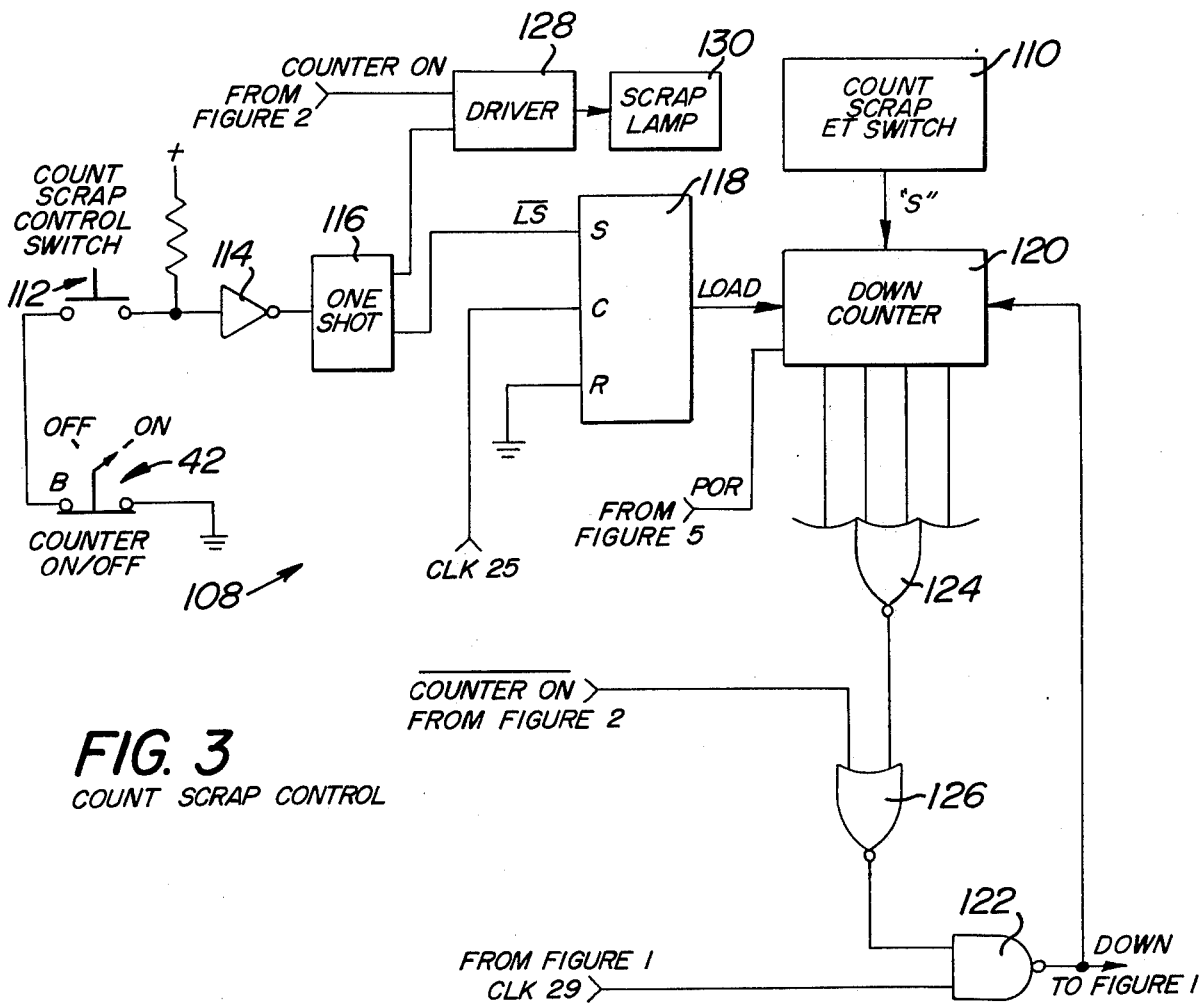
FIG. 3 is an electrical schematic of the count scrap control.

Counter on/off switch 42 is provided with two sets of contacts, labeled A in FIG. 2 and B in FIG. 3. When contacts A are closed, contacts B are open and vice-versa. When counter on/off switch 42 is in the "on" position, contacts A are open and the input to inverter 44 is "high". The output of inverter 44 is therefore "low", enabling NOR gate 46. The terms high and low are conventional terms denoting the levels of the digital signals described herein. A high digital level corresponds to a binary "1". A low digital level corresponds to a binary "0".

When NOR gate 46 is enabled, it inverts the PS output pulses the transmits them to NAND gate 48. As web material is sensed by measuring wheel 36, board present circuit 38 is caused to generate a high BP output which enables NAND gate 48 to invert and transmit the NOR gate 46 output to the up line to counter 28. Counter 28 is incremented one count by each pulse on the up line. Thus, counter 28 effectively counts the KE pulses to provide a running indication of the production count, the number of sheets of web material actually cut by knife 34.

When the counter on/off switch is in the "off" position, inverter 44 disables NOR gate 46 since the inverter input is grounded through contacts A. Accordingly, the PS output pulses cannot be transmitted to counter 28, that is, the counter is inhibited from providing an indication of the production count.

DYNAMIC CONTROL CIRCUIT

Counter 28 is dynamically incremented and decremented by dynamic control circuit 50 while it tracks the production count. See FIG. 6. Dynamic control circuit 50 selectively combines the parallel $\overline{CLK\ 1}$ - $\overline{CLK\ 31}$ pulse train outputs of multiple phase clock 30 to produce a serial pulse train at the increment 100 line input to counter 28. In addition, the dynamic control circuit transmits the $\overline{CLK\ 0}$ output of the multiple phase clock circuit to the decrement 1000 line input to counter 28. The $\overline{CLK\ 0}$ pulses are inverted replicas of the CLK 0 pulses. Each pulse on the increment 100 line increments counter 28 by 100 counts. Each pulse on the decrement 1000 line decrements counter 28 by 1000 counts. The increment 100 line pulses are fed to the hundreds stage of counter 28. The decrement 1000 line pulses are fed to the thousands stage of counter 28. See FIG. 1.

Figure 7:
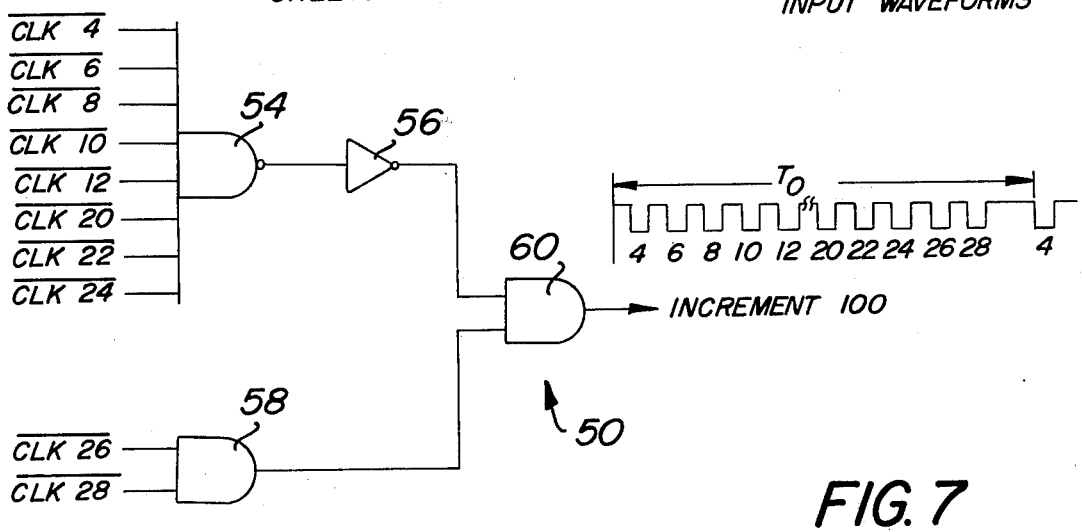
FIG. 7 is an electrical schematic of the dynamic control circuit.

The multiple phase clock outputs $\overline{CLK\ 4}$, $\overline{CLK\ 6}$, $\overline{CLK\ 8}$, $\overline{CLK\ 10}$, $\overline{CLK\ 12}$, $\overline{CLK\ 20}$, $\overline{CLK\ 22}$ and $\overline{CLK\ 24}$ are inverted by NAND gate 54 and again inverted and passed by inverter 56 to the input of AND gate 60. See FIG. 7. The multiple phase clock outputs $\overline{CLK\ 26}$ and CLK 28 are reflected through AND gate 58 to the input of AND gate 60. The output of AND gate 60 is a serial pulse train comprising the $\overline{CLK\ 4, 6, 8, 10, 12, 20, 22, 24, 26}$ and $\overline{28}$ pulses. The pulse train itself is repeated at the pulse repetition frequency of the multiple phase clock outputs which is in the inverse of the pulse repetition period denoted T0 in FIG. 7.

The pulse train output of NAND gate 60 is fed to the increment 100 line to counter 28. Each pulse in the train increments the hundreds stage of the counter. The $\overline{CLK\ 28}$ pulse is the tenth pulse in the train. Accordingly, the $\overline{CLK\ 28}$ pulse advances the counter to 1000 counts beyond the production count, the number of pulses counted on the up line to the counter. The production count represents the number of sheets actually cut by knife 34. The $\overline{CLK\ 0}$ pulse then decrements the counter by 1000 counts to return it to the production count. This incrementing and decrementing cycle is repeated throughout the production order.

The frequency at which counter 28 is incremented and decremented by the pulse train output of AND gate 60 and the $\overline{CLK\ 0}$ pulses is much greater than the frequency at which the KE pulses are generated by knife encoder 32. Thus, as the counter 28 counts the number of sheets cut by knife 34 at the pulse repetition frequency of the KE pulses, it is dynamically incremented and decremented at a much higher rate by the output of AND gate 60 and the $\overline{CLK\ 0}$ pulses. Dynamically varying the count maintained by counter 28 permits the warning levels to be selectable while eliminating multiple comparator controls, as will be evident from the following description.

WARNING SELECT AND ALARMS CIRCUIT

The number of sheets remaining to be cut (hereinafter "warning level") before warning lamp 14 is energized is a preselectable number. The operator selects the desired warning level by manipulating warning level switch 62 in warning select and alarms circuit 22. See FIG. 4. Warning level switch 62 is a rotary multiple position switch such as an Allen Bradley 4-position rotary switch. Each position corresponds to a particular warning level. It is preferred that at least four warning levels marked 100, 300, 600 and 800 be available. Different warning levels may also be used, depending on the particular operating requirements of the corrugator. For example, the operator may select any multiple of one hundred sheets as the warning level merely by using a rotary switch having the desired number of positions and by combining the switch output with the appropriate multiple phase clock circuit output as will be apparent from the following description.

The multiple phase clock outputs $\overline{CLK\ 4, 6, 8, 10, 12, 20, 22, 24, 26}$ and $\overline{28}$ successively increment counter 28 by 100 counts. See FIG. 6. At time intervals intermediate these $\overline{CLK}$ pulses, therefore, the production count is incremented by 100, 200, 300, 400, 500, 600, 700, 800, 900 and 1000 counts. These intermediate time intervals are occupied by the multiple phase clock circuit output pulses CLK 5, 7, 9, 11, 13, 21, 23, 25, 27 and 29 as indicated in Table I below. See also FIG. 6. The CLK 5, 7, 9, 11, 13, 21, 23 25, 27 and 29 pulses are inverted replicas of the $\overline{CLK\ 5, 7, 9, 11, 13, 21, 23, 25, 27}$ and $\overline{29}$ pulses.

Table 1

| CLK Pulse | Counter 28 Advanced By | Warning Level |
| --- | --- | --- |
| 5 | 100 | 100 |
| 7 | 200 | 200 |
| 9 | 300 | 300 |
| 11 | 400 | 400 |
| 13 | 500 | 500 |
| 21 | 600 | 600 |
| 23 | 700 | 700 |
| 25 | 800 | 800 |
| 27 | 900 | 900 |
| 29 | 1000 | 1000 |

For purposes of explanation, the following description of warning select and alarms circuit 22 is directed to the selection of a warning level of 100. It is understood, however, that the circuit operates identically when any of the other warning levels are selected, the only difference being in the particular multiple phase clock circuit output pulse to which circuit 22 responds.

When warning level switch 62 is set at 100, a low level signal is generated at the input to inverter 64. See FIG. 4. The output of inverter 64 enables AND gate 66 to pass the multiple phase clock output CLK 5. The output of AND gate 66 is inverted by NOR gate 68 and re-inverted and transmitted by inverter 70 to the input of NAND gate 72. If a T=C signal is generated at the output of comparator 20 at this time, it will be inverted by inverter 74 and re-inverted and transmitted by NOR gates 76 to enable NAND gate 72. The output of NAND gate 72 therefore sets warning flip-flop 78 in response to the CLK 5 pulse. This causes driver 80 to energize warning lamp 14. Warning flip-flop 78 may be a TI 74279 quadruple $\overline{S}$-$\overline{R}$ latch. Driver 80 may be a 75452 series peripheral driver. Warning lamp 14 may be an Allen Bradley 800MR-Q06A pilot light.

The T=C signal is generated by comparator 20 when the T output of total set thumb wheel switches 18 equals the C output of counter 28. The T and C outputs each comprise five BCD signals. T1 and C1 are units. T10 and C10 are tens. T100 and C100 are hundreds. T1000 and C1000 are thousands. And T10,000 and C10,000 are tens of thousands. When the T and C outputs are in equality, that is, when they coincide, it indicates that counter 28 has been incremented to the total number of sheets in the production order. This does not mean that the production order has been filled, since counter 28 is incremented by the pulses appearing at the increment 100 line input as well as the pulses at the up line input which indicate the actual number of sheets cut.

If the T and C outputs of thumb wheel switches 18 and counter 28 coincide when a CLK 5 pulse is generated, it indicates that the actual number of sheets cut incremented by 100 is equal to the total number of sheets to be cut in the production order. In other words, the coincidence of the T and C signals at this time indicates that the production count is 100 sheets less than the total number of sheets in the production order. Warning lamp 14 provides a visual indication of this event.

The warning lamp will remain on until the alarm cancel switch 82 is depressed. When the alarm cancel switch is depressed, it permanently shuts off the warning lamp. The alarm cancel switch may be depressed while 100 sheets remain to be cut to fill the production order or after additional sheets have been cut to reduce the number of sheets remaining to be cut to 99 or less.

If the alarm cancel switch is depressed immediately after the warning light goes on while 100 sheets remain to be cut to fill the production order, the warning lamp will shut off and remain shut off while additional sheets are cut. Thus, when the alarm cancel switch is depressed, it causes a low level signal to appear at the input to inverter 84. The output of inverter 84 is re-inverted and transmitted by NOR gate 86 in the form of an alarm cancel signal to reset the warning flip-flop 78. When the warning flip-flop is reset, it prevents driver 80 from energizing warning lamp 14. The alarm cancel output of NOR gate 86 also sets alarm enable flip-flop 88. When set, flip-flop 88 disables NOR gate 76. This prevents NAND gate 72 from setting warning flip-flop 78 again in response to the next CLK 5 pulse, thereby keeping the warning lamp off.

The alarm cancel switch can also be depressed after the production count is increased one or more counts to reduce the number of sheets remaining to be cut to less than 100. The first additional sheet cut while the warning lamp is on is indicated by an up pulse to counter 28 and to the reset input to alarm enable flip-flop 88. The up pulse therefore resets flip-flop 88, otherwise enabling NOR gate 76. The NOR gate, however, is disabled by the output of inverter 74 since the T and C signals no longer coincide and the output of comparator 20 drives the inverter output high. This prevents NAND gate 72 from setting warning flip-flop 78 in response to the next CLK 5 pulse. The alarm cancel switch can then be depressed to reset flip-flop 78 and shut off the warning lamp. NOR gate 76 remains disabled by inverter 74 since the T and C signals no longer coincide when a CLK 5 pulse is generated. Accordingly, the warning lamp remains off.

When the warning level switch 62 is set to the 300 position, inverter 90 enables AND gate 92 to pass a CLK 9 pulse to the input of NOR gate 68. The warning select and alarms circuit 22 operates as previously described in connection with the 100 setting of warning level switch 62 to energize warning lamp 14 when 300 sheets remain to be cut to fill the production order. When 300 sheets or less remain to be cut, the warning lamp can be shut off by the alarm cancel switch.

When warning level switch 62 is set to the 600 position, inverter 94 and AND gate 96 operate in conjunction to pass a CLK 21 pulse to the input of NOR gate 68. Warning select and alarms circuit 22 operates as previously described in connection with the 100 setting of warning level switch 62 to energize warning lamp 14 when 600 sheets remain to be cut to fill the production order. When 600 sheets or less remain to be cut, the warning lamp can be shut off by the alarm cancel switch.

When warning level switch 62 is set to the 800 position, inverter 98 and AND gate 102 operate in conjunction to pass a CLK 25 pulse to the input of NOR gate 68. Warning select and alarms circuit 22 operates as previously described in connection with the 100 setting of warning level switch 62 to energize warning lamp 14 when 800 sheets remain to be cut to fill the production order. When 800 sheets or less remain to be cut, the warning lamp can be shut off by the alarm cancel switch.

By providing additional positions on warning level switch 62 and selecting other of the warning level CLK pulses indicated in Table 1, it should be apparent that warning lamp 14 can be energized by warning select and alarms circuit 22 to indicate that any multiple of one hundred sheets remain to be cut to fill a production order. For example, a 200 position on switch 62 can be provided in conjunction with warning level CLK pulse 7 to energize lamp 14 when 200 sheets remain to be cut. A 1000 setting may also be provided on switch 62 in conjunction with warning level CLK pulse 29 to energize lamp 14 when 1000 sheets remain to be cut. Other combinations of switch positions and warning level CLK pulses should be obvious from the foregoing description of the operation of warning select and alarms circuit 22 and inspection of Table 1.

Although AND gates 66, 92, 96 and 102 and NOR gate 68 have been described as separate logic components, it should be understood that the overall configuration comprises an AND-OR-INVERT circuit 69 such as a TI 7454 4-wide AND-OR-INVERT gate.

An advantage of the invention is that warning level switch 62 need not be re-adjusted between changes in production orders. A change in production orders is effected by re-adjusting total set thumb wheel switch 18 to provide a new T output. During the new production order, the warning select and alarms circuit operates as previously described to provide the desired warning level indication without having to reset the warning level switch.

Warning select and alarm circuit 22 also indicates when a production order has been filled. When the production order is filled, the T and C outputs of total set thumb wheel switches 18 and counter 28 coincide. The T=C output of comparator 20 is inverted by inverter 74 and re-inverted and transmitted by NOR gate 76 to enable NAND gate 104. See FIG. 4. NAND gate 104 inverts a CLK 3 pulse generated by multiple phase clock 30 to set total flip-flop 106. When total flip-flop 106 is set, it causes driver 108 to energize total lamp 16. Since counter 28 is not incremented until a CLK 4 pulse appears at the multiple phase clock outputs, the contents of counter 28 represent the actual number of sheets cut when total lamp 16 is energized in response to the CLK 3 pulse. Thus, when energized, total lamp 16 indicates that the number of sheets actually cut equals the production order set at thumb wheel switch 18.

The alarm cancel switch can be depressed to permanently shut off total lamp 16 anytime after the production order is filled. When the alarm cancel switch is depressed, it causes NOR gate 86 to reset total flip-flop 106. This prevents driver 108 from energizing the total lamp. Accordingly, the lamp goes off.

If the alarm cancel switch is depressed while the production count equals the production order set at switch 18, the output of NOR gate 86 will set flip-flop 88, thereby disabling NOR gate 76. This prevents NAND gate 104 from again setting total flip-flop 106 in response to the next CLK 3 pulse, thereby keeping the total lamp off.

The alarm cancel switch can also be depressed after the production count is increased one or more counts beyond the production order. The first additional sheet cut while the total lamp is on is indicated by an up pulse to counter 28 and to the reset input to alarm enable flip-flop 88. The up pulse resets flip-flop 88, otherwise enabling NOR gate 76. The NOR gate, however, is disabled by the output of inverter 174 since the T and C signals no longer coincide and the output of comparator 20 drives the inverter output high. This prevents NAND gate 104 from setting flip-flop 106 in response to the next CLK 3 pulse. The alarm cancel switch can then be depressed to reset flip-flop 106 and shut off the total lamp. NOR gate 76 remains disabled by inverter 74 since the T and C signals no longer coincide. Accordingly, the total lamp remains off.

COUNT SCRAP CONTROL CIRCUIT

Count scrap control circuit 108 corrects the production count maintained by counter 28 to compensate for scrap sheets. See FIG. 3. Scrap sheets are those sheets cut by knife 34 which are unacceptable. These sheets must be excised from the production count.

Count scrap control circuit 108 corrects the production count in synchronism with multiple phase clock outputs CLK 25 and CLK 29. The operator estimates the number of scrap sheets being produced at a scrap correction station located at the delivery end of the corrugator. This estimate is set into scrap count set switch 110.

The count scrap control switch 112 is depressed to initiate operation of the count scrap control circuit when the counter on/off switch 42 is in the on position and contacts B are closed. See FIG. 3. When the count scrap control switch is depressed, it causes inverter 114 to trigger one shot 116. One shot 116 is used as a debounce circuit to make the system insensitive to switch bounce at the count scrap control switch. One shot 116 may be a TI 74121 monostable multivibrator. The one shot generates a $\overline{LS}$ signal of approximately 1 second duration which enables a pulse synchronizer 118 to invert and pass a single CLK 25 pulse to the load line input to down counter 120. The CLK 25 pulse is an inverted replica of the $\overline{CLK\ 25}$ pulse. Pulse synchronizer 118 may be a TI 74120 dual pulse synchronizer/driver. The load line signal presets down counter 120 to the S signal output of count scrap set switch 110. Down counter 120 may be a TI 74193 synchronous 4-bit up/down counter connected to count down only.

In correcting for scrap, counter 120 is counted down at the pulse repetition frequency of the CLK 29 pulses. The CLK 29 pulses generated by multiple phase clock circuit 30 are inverted by NAND gate 122 and transmitted to the input of counter 120 to count the counter down. See FIG. 3. The pulses at the output of NAND gate 122 are also fed to the down line input to counter 28. As counter 28 is counted up at the pulse repetition frequency of the KE pulses, it is counted down at the pulse repetition frequency of the CLK 29 pulses. The pulse repetition frequency of the CLK 29 pulses is much greater than that of the KE pulses. Thus, count scrap control circuit 108 almost instantaneously corrects the production count maintained by counter 28 by the estimated number of scrap sheets. The correction for the estimated number of scrap sheets takes place without interruption of the production count. Accordingly, the scrap correction can be repeated virtually as many times as desired during the production count.

Scrap correction ends when down counter 120 reaches zero. NOR gate 124 detects when the down counter has been counted down to zero and causes NOR gate 126 to disable NAND gate 122. NOR gates 124 and 126 may be TI 7425 dual four-input positive NOR gates. When disabled, NAND gate 122 cannot count down the counter 120 any further in response to the CLK 29 pulses. At the same time, NAND gate 122 cannot count down the counter 28 any further. That is, NAND gate 122 prevents any further correction of the production count once the down counter reaches zero.

The output of count scrap set switch 110 represents from one to nine scrap sheets. To correct for more than nine scrap sheets, the count scrap control switch 112 can be repeatedly depressed. For example, if it is desired to correct for 12 scrap sheets, switch 110 can be set to 6 and down counter 120 can be loaded twice with the switch 110 output. Each time counter 120 is loaded, it is rapidly counted down to zero at the CLK 29 pulse frequency. This occurs almost instantaneously.

Scrap lamp 130 provides a visual indication that scrap correction is taking place. When one shot 116 triggers pulse synchronizer 118 to preset down counter 120, the one shot also causes driver 128 to energize scrap lamp 130 for the duration of the LS output signal. The LS signal is an inverted replica of the $\overline{LS}$ signal. The LS output of one shot 116 preferably has a duration of approximately 1 second, far more than the time required to count the down counter to zero from the maximum scrap correction estimate. When the scrap lamp goes off, scrap correction can be repeated as previously described. Count scrap control switch 112, scrap lamp 130 and count scrap set switch 110 may be located in proximity to each other at the scrap correction station.

As previously mentioned, if counter on/off switch 42 is in the off position, it inhibits counter 28 from providing an indication of the production count. Additionally, if the counter on/off switch is in the off position, it prevents down counter 120 from being loaded with the count scrap set switch output. When the counter on/off switch is in the off position, contacts B are open and the input to inverter 114 remains high regardless of the position of count scrap control switch 112. Accordingly, the inverter is prevented from triggering one shot 116. Down counter 120, then, can only be loaded when the counter on/off switch is set to the on position, that is, when contacts B are closed.

CLEAR CIRCUIT

Figure 5:
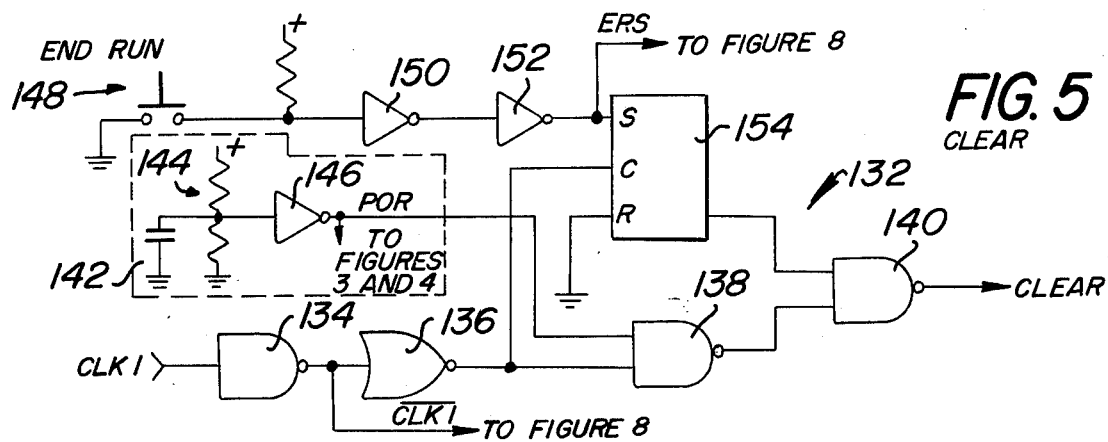
FIG. 5 is an electrical schematic of the clear circuit.

Clear circuit 132 generates a CLR signal which clears counter 28 in response to a CLK 1 pulse generated by multiple phase clock circuit 30. See FIG. 5. The CLK 1 pulse is an inverted replica of the $\overline{\text{CLK 1}}$ pulse. The CLK 1 pulses are inverted by NAND gate 134 and re-inverted by NOR gate 136. The output of NOR gate 136 is fed to the CS input of pulse synchronizer 154. Pulse synchronizer 154 may be a TI 74120 dual pulse synchronizer/driver. When end run switch 148 is not depressed, inverters 150 and 152 inhibit synchronizer 154 from passing the pulses at its CS input. The output of synchronizer 154 stays low and NAND gates 140 is prevented from passing any pulses to the CLR input of counter 28.

When a production order has been filled, counter 28 may be cleared in preparation for the next order. This is accomplished by merely depressing end run switch 148. When the end run switch is depressed, it causes inverters 150 and 152 to generate an ERS signal at the input to pulse synchronizer 154. The ERS signal causes synchronizer 154 to invert and pass a single pulse at the output of NOR gate 136 to the input of NAND gate 140. NAND gate 140 generates a pulse at the CLR line input to counter 28 thereby clearing the counter.

Clear circuit 132 also includes a power on reset circuit 142 which is used to enable NAND gate 140 and reset various components in dynamic production counter 10 when power is first applied thereto. When power is first applied, the capacitive and resistive elements 144 cause the voltage at the input to Schmitt trigger inverter 146 to rise gradually. When the input reaches a predetermined threshold level, inverter 146 generates a low POR signal which is inverted by NAND gate 138 to enable NAND gate 140. NAND gate 140 is then free to clear counter 28 when the end run switch is depressed.

The high POR signal is fed to down counter 120 in count scrap control circuit 108 to reset the counter. Before the input to inverter 146 reaches the predetermined threshold level, the POR signal is high. See FIG. 3. Simultaneously, the POR signal is fed to NOR gate 86 in the warning select and alarms circuit 22 to reset warning flip-flop 78 and total flip-flop 106 and to set alarm enable flip-flop 88. See FIG. 4.

STROBE AND DISPLAY CIRCUIT

Figure 8:
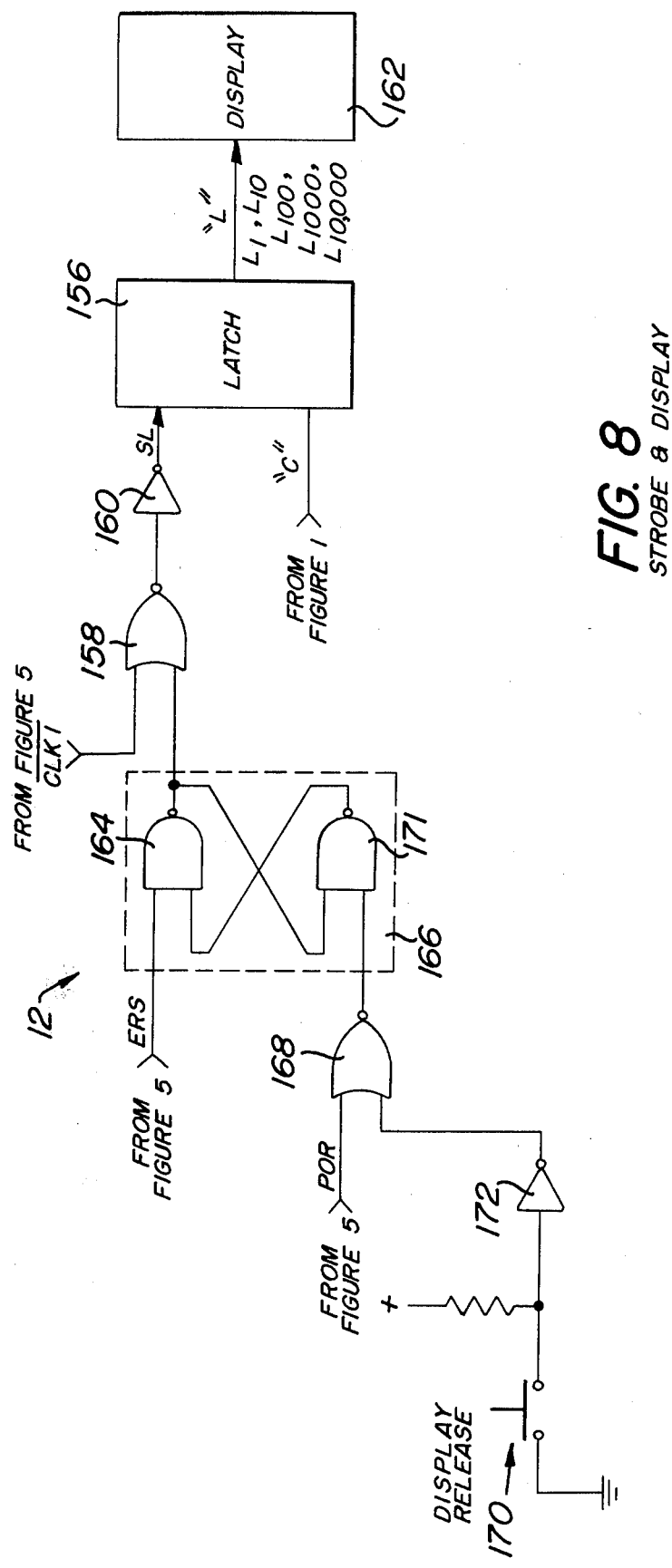
FIG. 8 is an electrical schematic of the strobe and display circuit.

The production count, the actual number of sheets cut by knife 34, is digitally displayed by means of strobe and display circuit 12. See FIG. 8. The circuit is activated by depressing display release switch 170.

When the display release switch is depressed, inverter 172 disables NOR gate 168. The NOR gate generates a low level signal at the input of NAND gate 171 in set-reset circuit 166. This drives the output of NAND gate 164 low, enabling NOR gate 158 to invert and pass the $\overline{\text{CLK 1}}$ pulses to inverter 160. Inverter 160 inverts the pulses and passes them to the SL input to latch 156.

The other input of latch 156 receives the C output of counter 28. Latch 156 may comprise TI 74116 dual four-bit latches and a TI 7475 four-bit bistable latch cascaded to provide five separate BCD inputs according to principles well known in the logic design art.

The pulses at the SL input of latch 156 strobe the latch to cause it to transfer the C output of counter 28 to the L output of the latch. The L output of the latch comprises five BCD outputs L1, L10, L100, L1000 and L10000. These outputs drive display 162. The display therefore indicates the production count at the pulse repetition frequency of the CLK 1 pulses.

The latch 156 and display 162 are disabled when the end run switch 148 in clear circuit 132 is depressed. See FIG. 5. When the end run switch is depressed, the ERS signal output of inverter 152 causes NAND gate 164 in set-reset circuit 166 to disable NOR gate 158. The NOR gate is thereby prevented from reflecting the $\overline{\text{CLK 1}}$ pulses to the SL input to latch 156. The latch therefore hangs up at the last production count indicated by counter 28. This count is displayed by display 162. Normally, this count represents the total number of sheets in the production order since the end run switch is not depressed until the production order is filled.

When display release switch 170 is released, the latch 156 and display 162 are inhibited from operating in response to the $\overline{\text{CLK 1}}$ pulses. When the display switch is released, inverter 172 causes NOR gate 168 to generate a high level output. This causes set-reset circuit 166 to disable NOR gate 158 from passing the $\overline{\text{CLK 1}}$ pulses to strobe latch 156 and display 162.

Advantages of the invention include preselectable warning levels which need not be re-adjusted between changes in production orders, elimination of multiple comparators, the ability to revise incorrect scrap estimates at virtually any time during the production count without interrupting the count, and digital display of the production count.

Unless otherwise specified, the inverters described herein may be TI 7414 hex Schmitt-trigger inverters (to reduce sensitivity to noise) or TI 7404 hex inverters. The AND gates may be TI 7408 quadruple 2-input positive AND gates. The NOR gates may be TI 7402 quadruple 2-input positive NOR gates. The NAND gates may be TI 7400 quadruple 2-input positive NAND gates or TI 7437 quadruple 2-input positive NAND buffers. The pulse synchronizers may all be TI 74120 dual pulse synchronizer/drivers. The flip-flops may all be TI 74279 quadruple S-R latches. The count scrap, end run, alarm cancel and display release switches may be Allen Bradley series 800 momentary contact switches. The counter on/off switch may be an Allen Bradley series 800 2-position rotary switch. The total and scrap lamps may be Allen Bradley series 800 pilot lights. Equivalent logic elements may be substituted for the components of the dynamic production counter according to conventional logic design principles.

Although the invention has been described in terms of providing a production count and warning level indications for a corrugator, it should be apparent that the applications of the invention are essentially universal. The invention can also be used to count and provide warning level indications of repetitive events of any kind.

The present invention may be embodied in other specific forms without departing from the spirit or essential attributes thereof and, accordingly, reference should be made to the appended claims, rather than to the foregoing specification as indicating the scope of the invention.

I claim:

1. In a corrugator including a knife for automatically cutting moving web material into sheets, an improved production counter for indicating the number of sheets cut by the knife, comprising:
    means for generating a first digital signal indicative of a predetermined number of sheets of web material to be cut by the knife;
    means for providing a second digital signal indicative of the number of sheets of web material cut by the knife;
    means for cyclically incrementing and decrementing said second digital signal by predetermined counts to cause said second digital signal to cyclically vary;
    means for detecting coincidence of said cyclically varied second digital signal to said first digital signal; and
    means for generating a warning signal indicative of a preselected number of sheets remaining to be cut in response to said detecting means.

2. The improved production counter according to claim 1 including means for digitally displaying the number of sheets of web material cut by the knife in response to said second digital signal.

3. The improved production counter according to claim 1 including means for generating a digital signal indicative of the number of sheets of scrap material produced by the knife and means for dynamically correcting said cyclically varied second digital signal in response thereto.

4. The improved production counter according to claim 3 including means for simultaneously inhibiting said means for dynamically correcting said cyclically varied second digital signal and said means for providing a second digital signal indicative of the number of sheets of web material cut by the knife.

5. The improved production counter according to claim 1 including means for generating a signal which indicates that the predetermined number of sheets of web material has been cut in response to said detecting means.

6. The improved production counter according to claim 5 including means for terminating said signal which indicates that the predetermined number of sheets of web material has been cut.

7. The improved production counter according to claim 1 including means for terminating said warning signal.

8. A production counter for a corrugator including a knife for automatically cutting moving web material into sheets, comprising:
    means for generating a first digital signal indicative of a predetermined number of sheets of web material to cut by the knife;
    means for providing a second digital signal indicative of the number of sheets of web material cut by the knife;
    means for cyclically incrementing and decrementing said second digital signal by predetermined counts to cause said second digital signal to cyclically vary;
    means for detecting coincidence of said cyclically varied second digital signal to said first digital signal; and
    means for generating a warning signal indicative of a preselected number of sheets remaining to be cut in response to said detecting means.

9. The production counter according to claim 8 including means for digitally displaying the number of sheets of web material cut by the knife in response to said second digital signal.

10. The production counter according to claim 8 including means for generating a digital signal indicative of the number of sheets of scrap material produced by the knife and means for dynamically correcting said cyclically varied second digital signal in response thereto.

11. An improved method of indicating the number of sheets of moving material automatically cut by a knife, comprising:
    generating a first digital signal indicative of a predetermined number of sheets of material to be cut by the knife;
    providing a second digital signal indicative of the number of sheets of material cut by the knife;
    cyclically incrementing and decrementing said second digital signal by predetermined counts to cause said second digital signal to cyclically vary;
    detecting coincidence of said cyclically varied second digital signal to said first digital signal; and
    generating a warning signal indicative of a preselected number of sheets of material remaining to be cut in response to said detecting means.

12. The method according to claim 11 including digitally displaying the number of sheets of material cut by the knife in response to said second digital signal.

13. The method according to claim 11 including generating a digital signal indicative of the number of sheets of scrap material produced by the knife, and dynamically correcting said cyclically varied second digital signal in response thereto.

* * * * *